United States Patent
Di Vincenzo

(10) Patent No.: US 11,929,121 B2
(45) Date of Patent: Mar. 12, 2024

(54) STORING ONE DATA VALUE BY PROGRAMMING A FIRST MEMORY CELL AND A SECOND MEMORY CELL

(71) Applicant: Micron Technology, Inc., Boise, ID (US)

(72) Inventor: Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 17/690,573

(22) Filed: Mar. 9, 2022

(65) Prior Publication Data

US 2023/0290413 A1    Sep. 14, 2023

(51) Int. Cl.
*G11C 16/04* (2006.01)
*G11C 16/10* (2006.01)
*G11C 16/26* (2006.01)
*G11C 16/30* (2006.01)

(52) U.S. Cl.
CPC ........ *G11C 16/102* (2013.01); *G11C 16/0433* (2013.01); *G11C 16/26* (2013.01); *G11C 16/30* (2013.01)

(58) Field of Classification Search
CPC ... G11C 16/102; G11C 16/0433; G11C 16/26; G11C 16/30
USPC ...................................................... 365/189.11
See application file for complete search history.

(56) References Cited

U.S. PATENT DOCUMENTS

| 10,658,041 | B1* | 5/2020 | Pilolli | G11C 16/10 |
| 11,249,897 | B2 | 2/2022 | Cho et al. | |
| 11,456,036 | B1* | 9/2022 | Lu | G11C 13/004 |
| 2007/0150693 | A1 | 6/2007 | Kaneko et al. | |
| 2011/0238899 | A1 | 9/2011 | Yano et al. | |
| 2014/0153332 | A1* | 6/2014 | Parthasarathy | G11C 29/52 365/185.09 |
| 2016/0358661 | A1* | 12/2016 | Vali | G11C 16/26 |
| 2019/0206490 | A1* | 7/2019 | Hosokawa | G06N 3/049 |
| 2022/0068377 | A1* | 3/2022 | Lu | G11C 13/0026 |
| 2022/0108746 | A1* | 4/2022 | Lu | G11C 13/004 |
| 2022/0246202 | A1* | 8/2022 | Sarpatwari | G11C 11/40622 |

* cited by examiner

*Primary Examiner* — Ly D Pham
(74) *Attorney, Agent, or Firm* — Brooks, Cameron & Huebsch, PLLC

(57) ABSTRACT

Apparatuses, methods, and systems for storing one data value by programming a first memory cell and a second memory cell are disclosed. The first memory cell and the second memory cell may each be programmed to a first data state, a second data state, or a third data state, and the one data value can correspond to a combination of the first data state, the second data state, or the third data state to which the first memory cell and the second memory cell are programmed, where two combinations of the first data state, the second data state, or the third data state to which the first memory cell is programmable and the first data state, the second data state, or the third data state to which the second memory cell is programmable are ineligible to correspond to the one data value.

20 Claims, 5 Drawing Sheets

|     | 330A | 330B |
|-----|------|------|
| 333 → | 1 | 0 |
|     | 1 | 1 | ← 331
| 334 → | 1 | T |
|     | 0 | 0 | ← 332
| 335 → | 0 | 1 |
| 336 → | 0 | T |
| 337 → | T | 0 |
| 338 → | T | 1 |
| 339 → | T | T |

STORING ONE DATA VALUE BY PROGRAMMING A FIRST MEMORY CELL AND A SECOND MEMORY CELL

TECHNICAL FIELD

The present disclosure relates generally to semiconductor memory and methods, and more particularly, to storing one data value by programming a first memory cell and a second memory cell.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in various architectures, such as a vertical pillar architecture with memory cells (e.g., resistance variable cells) arranged in word line layers, or a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

BRIEF DESCRIPTION OF THE DRAWINGS

FIG. 3 illustrates a table of data states to which a first memory cell and a second memory cell can be programmed, in accordance with an embodiment of the present disclosure.

DETAILED DESCRIPTION

Figure 1:
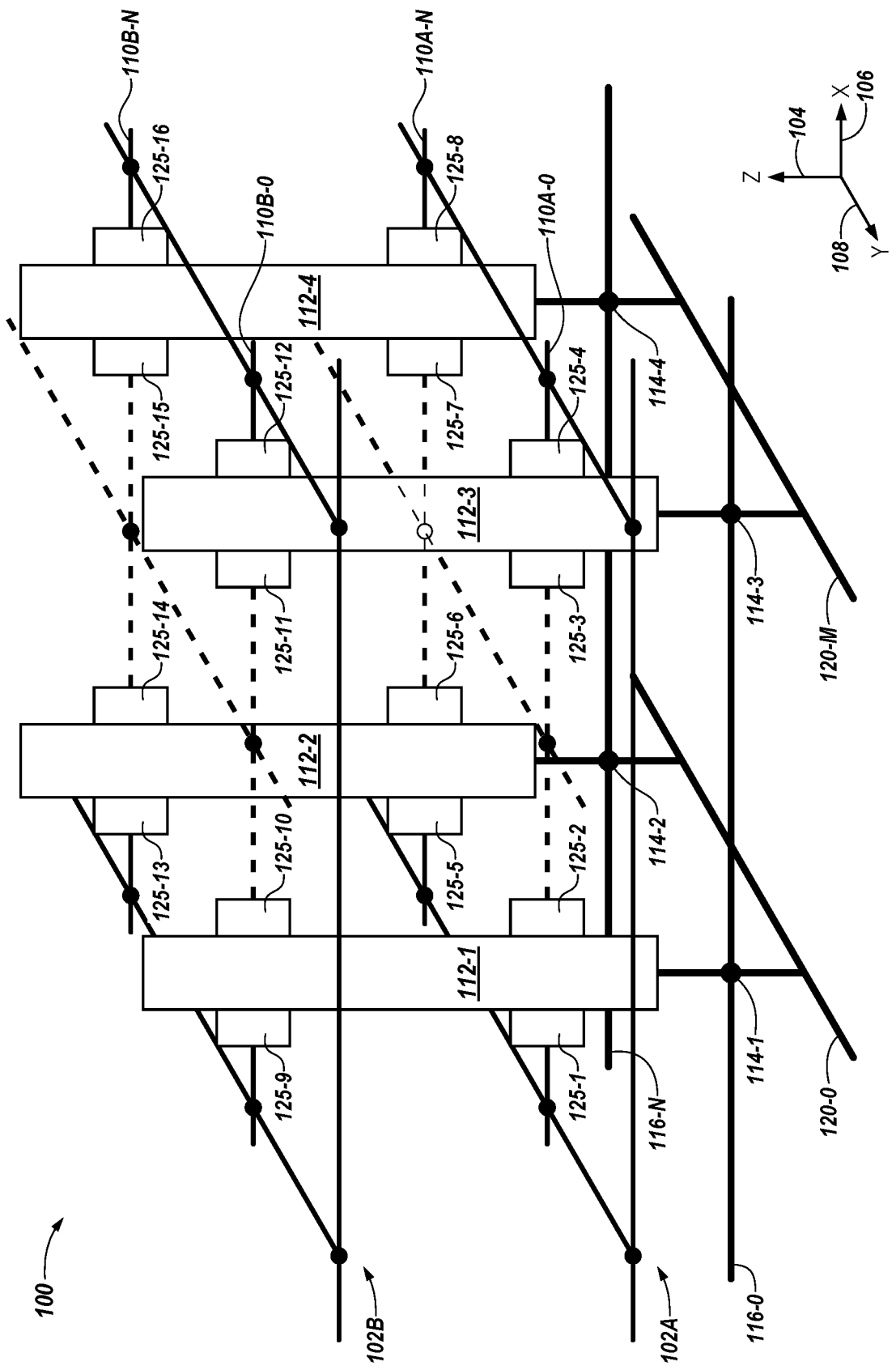
FIG. 1 is a three-dimensional view of a portion of an example of a memory array, in accordance with an embodiment of the present disclosure.

The present disclosure includes apparatuses, methods, and systems for storing one data value by programming a first memory cell and a second memory cell. The first memory cell and the second memory cell may each be programmed to a first data state, a second data state, or a third data state, and the one data value can correspond to a combination of the first data state, the second data state, or the third data state to which the first memory cell is programmed and the first data state, the second data state, or the third data state to which the second memory cell is programmed. Two combinations of the first data state, the second data state, or the third data state to which the first memory cell is programmable and the first data state, the second data state, or the third data state to which the second memory cell is programmable are ineligible to correspond to the one data value.

As discussed further herein, when performing a sense operation (e.g., distinguishing between data states as part of a read operation) on a resistance variable memory cell, such as a self-selecting memory cell, a positive voltage and a negative voltage may be applied to the cell (e.g., for memory cells having a same access line (word line) during the sense operation). The application of the positive voltage or the negative voltage, which may be part of and/or referred to as a bipolar sense operation, may cause a memory cell, depending on which data state that memory cell is programed to, to switch data states (e.g., snap back). Due to the memory cell switching (e.g., from a higher impedance state to a lower impedance state) in response to the applied voltage of the sense operation, some of the power provided for the bipolar sense operation will be consumed.

As discussed further herein, a resistance variable memory cell can be programmable to one of three different data states, and two (e.g., a pair) of such cells can be used to store one (e.g., a single) data value. Embodiments of the present disclosure provide that two combinations of the first data state, the second data state, or the third data state to which the first memory cell of the pair is programmable and the first data state, the second data state, or the third data state to which the second memory cell of the pair is programmable are ineligible to correspond to the one data value, while the seven other combinations are eligible to correspond to the one data value. Providing that the two combinations are ineligible to correspond to the one data value can reduce the amount of power consumed during a bipolar sense operation performed to determine (e.g., read) the one data value stored by the two cells.

Embodiments of the present disclosure provide a first of the two ineligible combinations can correspond to the first memory cell being programmed to the first data state (e.g., state 0) and the second memory cell being programmed to the first data state. A second of the two ineligible combinations can correspond to the first memory cell being programmed to the second data state (e.g., state 1) and the second memory cell being programmed to the second data state. These two ineligible combinations would correspond to the greatest power amount of consumption if these memory cells switched states during a sense operation, as compared to the power consumption corresponding to the other seven eligible combinations if the memory cells switched states during a sense operation. For instance, for a negative polarity portion of a bipolar sense operation, both cells can switch states (e.g., consume power) if both memory cells are programmed to the first data state (e.g, state 0). Also, for a positive polarity portion of a bipolar sense operation, both cells can switch states (e.g., consume power) if both memory cells are programmed to the second data state (e.g, state 1). This double switching can consume twice as much power, as compared to a pair of memory cells in which the state of only one memory cell of the pair switches.

Also, providing the two ineligible combinations can provide an improved (e.g., reduced) power consumption on a joules per bit basis. For instance, Ew can be considered the energy utilized to bias a word line during a sense operation performed on a memory cell of a memory array having a pillar architecture, and Eb can be considered the energy utilized to bias a digit (e.g., bit) line during the sense operation. Accordingly, the energy to bias two memory cells can be determined as 2 Ew+2 Eb. Providing that the two combinations, as previously mentioned, are ineligible, however, then the energy per bit utilized to bias two memory cells (containing 2.62 potential bits due to ineligible combinations) is equal to (1/2.62)(Ew+2 Eb) joules per bit, while biasing two memory cells (containing 3 bits due to no ineligible combinations) is equal to (⅔)(Ew+Eb) joules/bit. A ratio (2.62 bits/3 bits) of these energy per bit calculations provides that 0.57(1+Eb/(Ew+Eb)) is approximately 85%. Considering that Ew=Eb, this indicates an improved (e.g., reduced) power consumption of approximately 15%, as compared to sense operations performed on memory cells having no ineligible combinations.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of a portion of an example of a memory array 100 (e.g., a three-dimensional vertical pillar memory array), in accordance with an embodiment of the present disclosure. Memory array 100 may include a plurality of first signal lines (e.g., first access lines), which may be referred to as word lines 110A-0 to 110A-N and 110B-0 to 110B-N, and a plurality of second signal lines (e.g., second access lines), which may be referred to as sense (e.g., digit or bit) lines 120-0 to 120-M.

FIG. 1 shows a plurality of planes 102A, 102B (e.g., layers or levels). While two planes are shown in FIG. 1, embodiments are not so limited, and may include more than two planes. As shown in FIG. 1, the planes 102A, 102B are separated in a z-direction 104 (e.g., separated vertically) from one another. FIG. 1 further illustrates an x-direction 106 (e.g., a first horizontal direction) and a y-direction 108 (e.g., a second horizontal direction). While not shown in FIG. 1, for clarity and so as not to obscure embodiments of the present disclosure, components of the memory array 100, as well as different layers of the memory array 100 may be separated by an insulation material (e.g., a dielectric material).

The memory array 100 may include a number of conductive pillars 112-1, 112-2, 112-3, 112-4. The conductive pillars 112-1, 112-2, 112-3, 112-4 can comprise a metallic (or semi-metallic) material or a semiconductor material such as a doped polysilicon material, among others. Various types of conductive pillars may be utilized. For instance, the conductive pillars 112-1, 112-2, 112-3, 112-4 may be tubular, or have other shapes. The conductive pillars 112-1, 112-2, 112-3, 112-4 may have a hollow center or a solid center, for example.

As shown in FIG. 1, each of the conductive pillars 112-1, 112-2, 112-3, 112-4 may be respectively coupled to a sense line 120-0 to 120-M via a select element 114-1, 114-2, 114-3, 114-4 (e.g., switch). An example of the select element is a thin-film transistor (tft); however, embodiments are not so limited. The select element 114-1, 114-2, 114-3, 114-4 can be driven by a gateline 116-0 to 116-N, for example. Activating (e.g., biasing) a select element coupled to a particular conductive pillar may provide that an operation (e.g., a sense operation or a programming operation) may be performed on one or more memory cells coupled to the particular conductive pillar.

As shown in FIG. 1, the memory array 100 includes a number of memory cells 125-1 to 125-16. Each of the memory cells 125-1 to 125-16 can be coupled to one of the first signal lines 110. For instance, as shown in FIG. 1, memory cells 125-1 to 125-4 are coupled to first signal line 110A-0, while memory cells 125-13 to 125-16 are coupled to first signal line 110B-N. Each of the memory cells 125-1 to 125-16 can be coupled to one of the conductive pillars 112. For instance, as shown in FIG. 1, memory cells 125-1 and 125-2 are coupled to conductive pillar 112-1, while memory cells 125-15 and 125-16 are coupled to conductive pillar 112-4. Each of the memory cells 125-1 to 125-16 can be coupled to one of the second signal lines 120. For instance, as shown in FIG. 1, memory cells 125-1, 125-2, 125-5, 125-6, 125-9, 125-10, 125-13 and 125-14 are coupled to second signal line 120-0, while memory cells 125-3, 125-4, 125-7, 125-8, 125-11, 125-12, 125-15 and 125-16 are coupled to second signal line 120-M. The memory cells 125 may be programmable to one of three different data states, as will be further described further herein.

Such three-state programming can be useful in supporting complex memory operations, such as, for instance, machine learning applications, in which data is encoded and matching functions or partial matching functions (e.g., Hamming distances) are computed. For instance, such three-state programming can support the computation of the matching function or partial matching function of an input vector pattern with many stored vectors in an efficient manner.

The memory cells 125 may be resistance variable memory cells, for example. The memory cells 125 may include a material programmable to different data states (e.g., a set state, a reset state, or a "T" state). In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials (e.g., chalcogenide storage materials) may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a three-dimensional vertical pillar architecture having a plurality of vertically oriented (e.g., vertical) conductive pillars and a plurality of horizontally oriented (e.g., horizontal) access lines, as illustrated in FIG. 1. Embodiments of the present disclosure, however, are not limited to the example memory array architecture illustrated in FIG. 1. For example, embodiments of the present disclosure can include a cross-point architecture with memory cells (e.g., resistance variable cells) being located at intersections of a first and second signal lines used to access the cells (e.g., at topological cross-points between of word lines and bit lines). That is, embodiments of the present disclosure can include a three-dimensional cross-point memory array.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
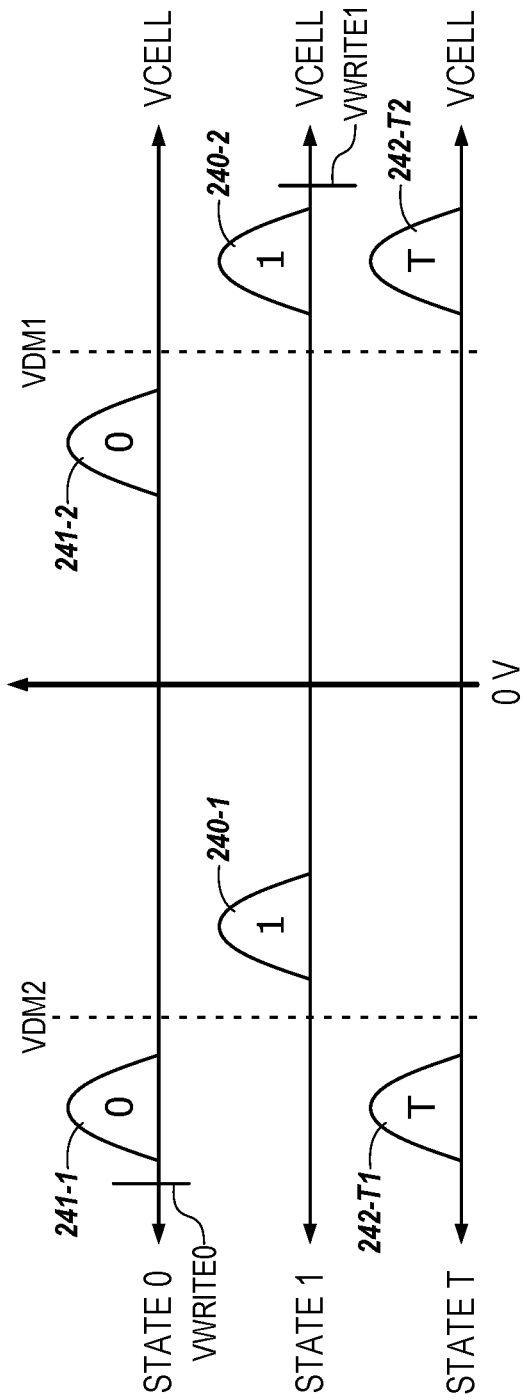
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of three possible data states (e.g., a first data state 0, a second state 1, or a third state T). That is, FIG. 2A illustrates threshold voltage distributions associated with three possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 240-1, 240-2, 241-1, 241-2, 242-T1, and 242-T2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
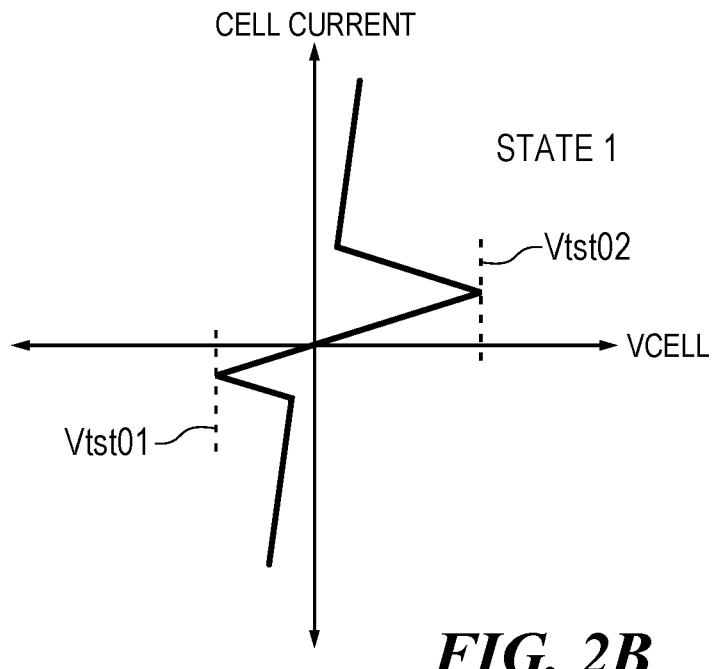
FIG. 2B is an example of a current-versus-voltage curve corresponding to a memory state of FIG. 2A, in accordance with an embodiment of the present disclosure.
Figure 2C:
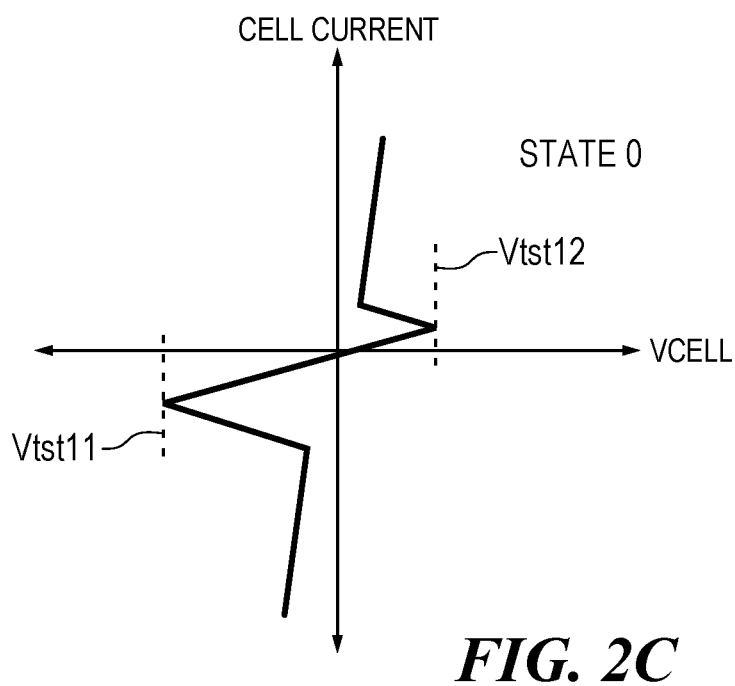
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 241-1 and 241-2) whose magnitude is greater for a negative polarity than a positive polarity, and a second data state (e.g., state 1) is associated with a second asymmetric threshold voltage distribution (e.g., threshold voltage distributions 240-1 and 240-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

In some examples, the magnitudes of the threshold voltages of a memory cell 125 in a particular state may be symmetric for different polarities, as shown in FIG. 2A. For example, the threshold voltage of a memory cell 125 programmed to state T may have the same magnitude in opposite polarities. For instance, in the example illustrated in FIG. 2A, a third data state (e.g., state T) is associated with a symmetric threshold voltage distribution (e.g., threshold voltage distributions 242-T1 and 242-T2) whose magnitude is substantially equal (e.g. high) for both a positive polarity and a negative polarity. In such an example, an applied voltage magnitude sufficient to cause a memory cell 125 to snap back can be the same for different applied voltage polarities.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 241-2) from cells in state 1 (e.g., threshold voltage distribution 240-2) or state T (e.g., threshold voltage distribution 242-T2). Similarly, VDM2 is a negative voltage used to distinguish cells in state 1 (e.g., threshold voltage distribution 240-1) from cells in state 0 (e.g., threshold voltage distribution 241-1) or state T (e.g., threshold voltage distribution 242-T1). In the examples of FIGS. 2A-2C, a memory cell 125 in a positive state 1 or T does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 or T does not snap back in response to applying VDM2.

Embodiments are not limited to the example shown in FIG. 2A. For example, the designations of state 0 and state 1 can be interchanged (e.g., distributions 241-1 and 241-2 can be designated as state 1 and distributions 240-1 and 240-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 240-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 240-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 241-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 241-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 241-2). As such, in a number of embodiments, a snapback event can be used to write a cell to the opposite state (e.g., from state 1 to state 0 and vice versa).

FIG. 3 illustrates a table of data states to which a first memory cell (e.g., memory cell 125-1) and a second memory cell (e.g., memory cell 125-2) can be programmed, in accordance with an embodiment of the present disclosure. FIG. 3 illustrates, as previously discussed, that the memory cells (e.g., memory cells 125-1, 125-2) are each programmable to a first data state (e.g., 0), a second data state (e.g., 1), or a third data state, (e.g., T).

As shown in FIG. 3, column 330A indicates data states to which a first memory cell (e.g., memory cell 125-1) can be programmed and column 330B indicates data states to which a second memory cell (e.g., memory cell 125-2) can be programmed. Each row of the table corresponds to a different combination of the data states to which the first memory cell and the second memory cell can be programmed.

Embodiments provide that the first memory cell (e.g., memory cell 125-1, corresponding to column 330A) and the second memory cell (e.g., memory cell 125-2, corresponding to column 330B) can form a pair of memory cells that can be coupled to a same access line (e.g., word line) of a memory array. Embodiments provide that each memory cell that is coupled to a same access line (e.g., word line) of a memory array can form a pair of memory cells. For instance, each particular memory cell coupled to a same access line (e.g., word line) of a memory array can form a pair of memory cells with one other memory cell that is adjacent (e.g., along the same access line) to the particular memory cell. Further, in some embodiments, the pair of memory cells can also be coupled to the same sense line (e.g., the same conductive pillar).

The first and second (e.g., the pair of) memory cells can be selected and used to store one (e.g., a single) data value by programming the first cell to one of the three data states and programming the second cell to one of the three data states. The one data value can correspond to the data state combination to which the first and second cells are programmed. However, two of the possible data state combinations can be ineligible to correspond to the one data value (e.g., only seven of the nine data state combinations illustrated in FIG. 3 may be eligible to correspond to the data value).

Embodiments provide that selecting the pair of memory cells can include applying a first voltage to the same access line to which the cells are coupled, and applying a second voltage to the sense line to which the cells are coupled, wherein a magnitude of the second voltage is greater than a magnitude of the first voltage. For instance, the magnitude of the second voltage can be twice the magnitude of the first voltage.

As previously mentioned, two combinations of the first data state, the second data state, or the third data state to which the first memory cell is programmable and the first data state, the second data state, or the third data state to which the second memory cell is programmable can be ineligible to correspond to the one data value. As such, the first and second memory cells would not be programmed to these two data state combinations to store the one data value. However, seven other combinations can be eligible to correspond to the one data value, and the first and second memory cells can be programmed to one of these seven combinations to store the one data value.

Row 331 illustrates a combination that can be ineligible to correspond to the one data value. In this combination, the first memory cell, corresponding to column 330A, would be programmed to the second data state (e.g., state 1) and the second memory cell, corresponding to column 330B, can be programmed to the second data state (e.g., state 1). That is, the first and second memory cell both being programmed to the second data state can be one of the two ineligible combinations to correspond to the one data value. As such, embodiments of the present disclosure provide that the first and second memory cells would not both be programmed to the second data state to store the one data value.

Row 332 illustrates a combination that can be ineligible to correspond to the one data value. In this combination, the first memory cell, corresponding to column 330A, would be programmed to the first data state (e.g., state 0) and the second memory cell, corresponding to column 330B, would be programmed to the first data state (e.g., state 0). That is, the first and second memory cell both being programmed to the first data state can be one of the two ineligible combinations to correspond to the one data value. As such, embodiments of the present disclosure provide that the first and second memory cells would not both be programmed to the first data state to store the one data value.

Row 333 illustrates a combination that can be eligible to correspond to the one data value (e.g., a data state combination to which the first and second memory cells may be programmed). In this combination, the first memory cell, corresponding to column 330A, can be programmed to the second data state (e.g., state 1) and the second memory cell, corresponding to column 330B, can be programmed to the first data state (e.g., state 0).

Row 334 illustrates a combination that can be eligible to correspond to the one data value. In this combination, the first memory cell, corresponding to column 330A, can be programmed to the second data state (e.g., state 1) and the second memory cell, corresponding to column 330B, can be programmed to the third data state (e.g., state T).

Row 335 illustrates a combination that can be eligible to correspond to the one data value. In this combination, the first memory cell, corresponding to column 330A, can be programmed to the first data state (e.g., state 0) and the second memory cell, corresponding to column 330B, can be programmed to the second data state (e.g., state 1).

Row 336 illustrates a combination that can be eligible to correspond to the one data value. In this combination, the first memory cell, corresponding to column 330A, can be programmed to the first data state (e.g., state 0) and the second memory cell, corresponding to column 330B, can be programmed to the third data state (e.g., state T).

Row 337 illustrates a combination that can be eligible to correspond to the one data value. In this combination, the first memory cell, corresponding to column 330A, can be programmed to the third data state (e.g., state T) and the second memory cell, corresponding to column 330B, can be programmed to the first data state (e.g., state 0).

Row 338 illustrates a combination that can be eligible to correspond to the one data value. In this combination, the first memory cell, corresponding to column 330A, can be programmed to the third data state (e.g., state T) and the second memory cell, corresponding to column 330B, can be programmed to the second data state (e.g., state 1).

Row 339 illustrates a combination that can be eligible to correspond to the one data value. In this combination, the first memory cell, corresponding to column 330A, can be programmed to the third data state (e.g., state T) and the second memory cell, corresponding to column 330B, can be programmed to the third data state (e.g., state T).

As previously discussed, providing the two combinations of the first data state, the second data state, or the third data state to which the first memory cell can be programmed to and the first data state, the second data state, or the third data state to which the second memory cell can be programmed to be ineligible to correspond to the one data value, while providing the seven other combinations to be eligible to correspond to the one data value, can reduce the amount of power consumed during a sense operation (e.g., a bipolar sense operation) performed to determine (e.g., read) the one data value stored by the two cells.

Embodiments provide that the one data value stored by the two cells can be determined by performing a sense operation (e.g., a bipolar sense operation) on the first memory cell and the second memory cell, after the two cells have been programmed. For instance, circuitry may be utilized to determine (e.g., read) the one data value stored by the two cells.

Embodiments provide that determining the one data value stored by the two cells can include applying a positive sensing voltage to the first memory cell and the second memory cell and applying a negative sensing voltage to the first memory cell and the second memory cell. The application of the positive voltage and the negative voltage may be part of and/or referred to as a bipolar sense operation (e.g., to determine the one data value stored by the two cells).

As mentioned, embodiments provide that each memory cell that is coupled to a same access line (e.g., word line) of a memory array can form a respective pair of memory cells. As such, additional memory cells (e.g., memory cells in addition to the first memory cell and the second memory cell as previously discussed) can be utilized as pairs (e.g., with two respective memory cells for each respective pair) to store a respective one data value. For example, a third memory cell and a fourth memory cell that are coupled to the same access line can each respectively store one data value (e.g., that is in addition to the one data value stored by the first memory cell and the second memory cell as previously discussed) by programming the third memory cell and the fourth memory cell to the first data state, the second data state, or the third data state, where, as discussed, two combinations of the first data state, the second data state, and the the third data state are ineligible to correspond to the additional one data value stored by the third and fourth cells.

Figure 4:
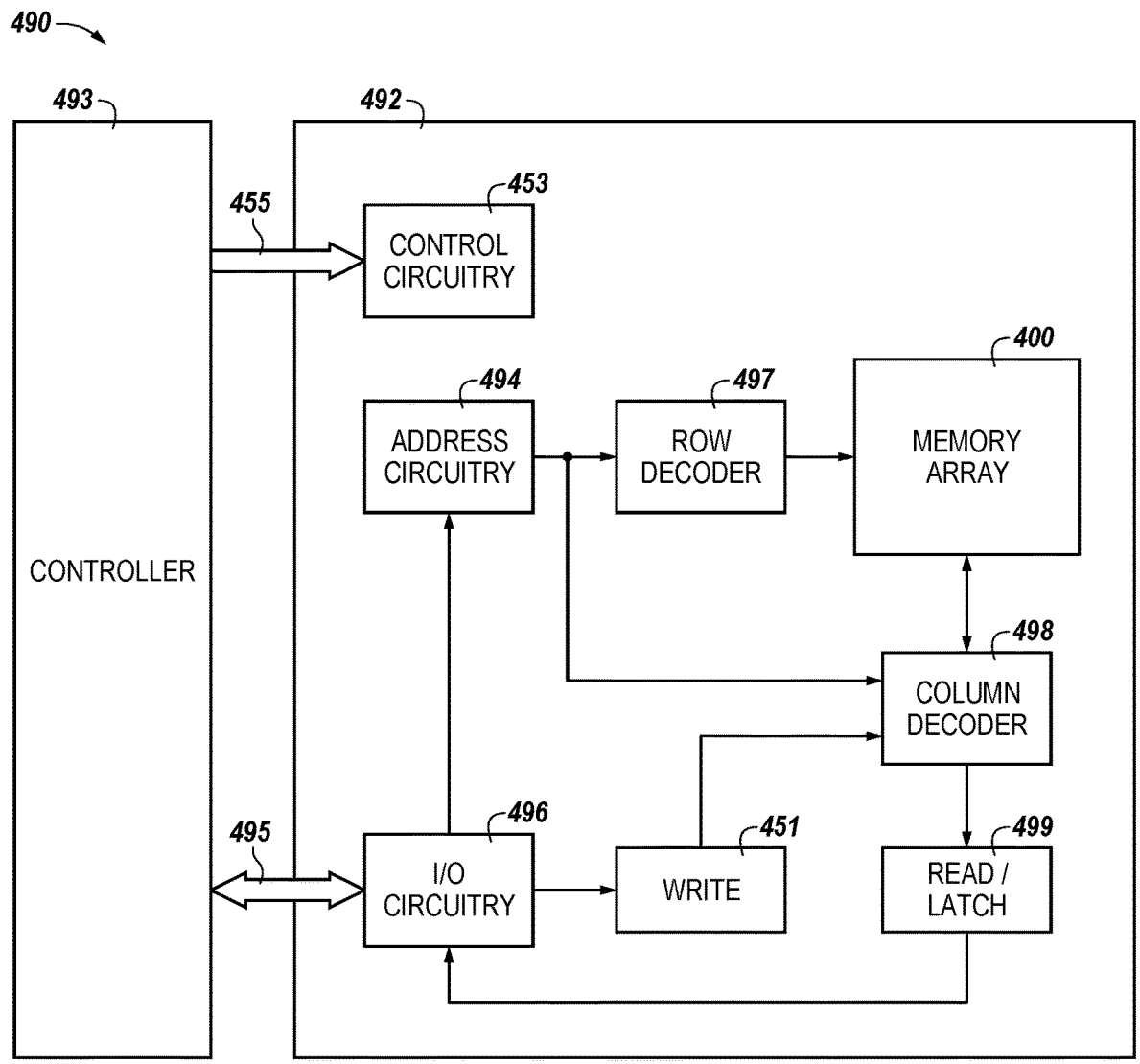
FIG. 4 is a block diagram illustration of an example apparatus, in accordance with an embodiment of the present disclosure.

FIG. 4 is a block diagram illustration of an example apparatus, such as an electronic memory system 490, in accordance with an embodiment of the present disclosure. Memory system 490 may include an apparatus, such as a memory device 492 and a controller 493, such as a memory controller (e.g., a host controller). Controller 493 might include a processor, for example. Controller 493 might be coupled to a host, for example, and may receive command signals (or commands), address signals (or addresses), and data signals (or data) from the host and may output data to the host. Controller 493 can perform one or more operations for storing one data value by programming a first memory cell and a second memory cell, in accordance with the present disclosure.

Memory device 492 includes a memory array 400 of memory cells. For example, memory array 400 may include one or more of the memory arrays, such as a vertical pillar array, of memory cells discussed herein. Memory device 492 may include address circuitry 494 to latch address signals provided over I/O connections 495 through I/O circuitry 496. Address signals may be received and decoded by a row decoder 497 and a column decoder 498 to access the memory array 400.

Memory device 492 may sense (e.g., read) data in memory array 400 by sensing voltage and/or current changes in the memory array columns using sense/buffer circuitry that in some examples may be read/latch circuitry 499. Read/latch circuitry 499 may read and latch data from the memory array 400. Sensing circuitry (not shown) may include a number of sense amplifiers coupled to memory cells of memory array 400, which may operate in combination with the read/latch circuitry 499 to sense (e.g., read) memory states from targeted memory cells. I/O circuitry 496 may be included for bi-directional data communication over the I/O connections 495 with controller 493. Write circuitry 451 may be included to write data to memory array 400.

Control circuitry 453 may decode signals provided by control connections 455 from controller 493. These signals may include chip signals, write enable signals, and address latch signals that are used to control the operations on memory array 400, including data read and data write operations.

Control circuitry 453 may be included in controller 493, for example. Controller 493 may include other circuitry, firmware, software, or the like, whether alone or in combination. Controller 493 may be an external controller (e.g., in a separate die from the memory array 400, whether wholly or in part) or an internal controller (e.g., included in a same die as the memory array 400). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. he scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory array including a plurality of memory cells, wherein each of the plurality of memory cells is programmable to a first data state, a second data state, or a third data state; and
circuitry coupled to the memory array, wherein the circuity is configured to:
select a first memory cell and a second memory cell from the plurality of memory cells, wherein the first memory cell and the second memory cell are coupled to a same access line of the memory array; and
store one data value by programming the first memory cell to the first data state, the second data state, or the third data state and by programming the second memory cell to the first data state, the second data state, or the third data state, wherein:
the one data value corresponds to a combination of the first data state, the second data state, or the third data state to which the first memory cell is programmed and the first data state, the second data state, or the third data state to which the second memory cell is programmed; and
two combinations of the first data state, the second data state, or the third data state to which the first memory cell is programmable and the first data state, the second data state, or the third data state to which the second memory cell is programmable are ineligible to correspond to the one data value.

2. The apparatus of claim 1, wherein the circuity is configured to perform a bipolar sense operation on the first memory cell and the second memory cell to determine the one data value.

3. The apparatus of claim 2, wherein performing the bipolar sense operation comprises:
applying a positive sensing voltage to the first memory cell and the second memory cell; and
applying a negative sensing voltage to the first memory cell and the second memory cell.

4. The apparatus of claim 1, wherein the first memory cell and the second memory cell are located adjacent to one another along the same access line.

5. The apparatus of claim 1, wherein each memory cell of the of the plurality of memory cells that is coupled to the same access line forms a pair of memory cells with a different memory cell of the of the plurality of memory cells that is coupled to the same access line.

6. The apparatus of claim 1, wherein one of the two combinations that are ineligible to correspond to the one data value corresponds to the first data state to which the first memory cell is programmable and the first data state to which the second memory cell is programmable.

7. The apparatus of claim 1, wherein one of the two combinations that are ineligible to correspond to the one data value corresponds to the second data state to which the first memory cell is programmable and the second data state to which the second memory cell is programmable.

8. The apparatus of claim 1, wherein each memory cell of the of the plurality of memory cells comprises a chalcogenide storage material.

9. The apparatus of claim 1, wherein the same access line is a word line.

10. The apparatus of claim 1, wherein selecting the first memory cell and the second memory cell from the plurality of memory cells comprises applying a first voltage to the same access line of the memory array and applying a second voltage to a sense line of the memory array, wherein a magnitude of the second voltage is greater than a magnitude of the first voltage.

11. A method of operating memory, the method comprising:
   selecting a first memory cell and a second memory cell of a memory device, wherein the first memory cell and a second memory cell are coupled to a same access line of the memory device; and
   storing one data value by programming the first memory cell to a first data state, a second data state, or a third data state and by programming the second memory cell to the first data state, the second data state, or the third data state, wherein:
      the one data value corresponds to a combination of the first data state, the second data state, or the third data state to which the first memory cell is programmed and the first data state, the second data state, or the third data state to which the second memory cell is programmed; and
      two combinations of the first data state, the second data state, and the third data state are ineligible to correspond to the one data value.

12. The method of claim 11, wherein the method includes performing, after programing the first memory cell and the second memory cell, a sense operation on first memory cell and the second memory to determine the stored one data value.

13. The method of claim 11, wherein the one data value corresponds to one of seven eligible combinations of the first data state, the second data state, and the third data state.

14. The method of claim 11, wherein the method includes storing the one data value by:
   programming the first memory cell to the second data state and programming the second memory cell to the first data state;
   programming the first memory cell to the second data state and programming the second memory cell to the third data state;
   programming the first memory cell to the first data state and programming the second memory cell to the second data state;
   programming the first memory cell to the first data state and programming the second memory cell to the third data state;
   programming the first memory cell to the third data state and programming the second memory cell to the first data state;
   programming the first memory cell to the third data state and programming the second memory cell to the second data state; or
   programming the first memory cell to the third data state and programming the second memory cell to the third data state.

15. The method of claim 11, wherein the method includes:
   selecting a third memory cell and a fourth memory cell of the memory device, wherein the third memory cell and the fourth memory cell are coupled to the same access line; and
   storing an additional one data value by programming the third memory cell and the fourth memory cell to the first data state, the second data state, or the third data state, wherein:
      the additional one data value corresponds to a combination of the first data state, the second data state, or the third data state to which the third memory cell is programmed and the first data state, the second data state, or the third data state to which the fourth memory cell is programmed; and
      two combinations of the first data state, the second data state, and the third data state are ineligible to correspond to the additional one data value.

16. An apparatus, comprising:
   a memory array including a plurality of memory cells; and
   circuitry coupled to the array of memory cells, wherein the circuitry is configured to:
      select a pair of memory cells from the plurality of memory cells, wherein the pair of memory cells are located adjacent to one another along a same access line of the memory array; and
      store one data value by programming a first memory cell of the pair of memory cells to a first data state, a second data state, or a third data state and by programming a second memory cell of the pair of memory cells to the first data state, the second data state, or the third data state, wherein:
         the one data value corresponds to a combination of the first data state, the second data state, or the third data state to which the first memory cell of the pair of memory cells is programmed and the first data state, the second data state, or the third data state to which the second memory cell of the pair of memory cells is programmed; and
         two combinations of the first data state, the second data state, or the third data state to which the first memory cell of the pair of memory cells is programmable and the first data state, the second data state, or the third data state to which the second memory cell of the pair of memory cells is programmable are ineligible to correspond to the one data value.

17. The apparatus of claim 16, wherein selecting the pair of memory cells comprises applying a first voltage to the same access line of the memory array and applying a second voltage to a sense line of the memory array, wherein a magnitude of the second voltage is twice a magnitude of the first voltage.

18. The apparatus of claim 16, wherein the pair of memory cells are coupled to a same sense line of the memory array.

19. The apparatus of claim 16, wherein the memory array is a cross-point array.

20. The apparatus of claim 16, wherein the memory array is a vertical pillar array.

* * * * *